(12) United States Patent
Besemer et al.

(10) Patent No.: US 10,452,309 B2
(45) Date of Patent: Oct. 22, 2019

(54) METHOD AND DEVICE OPERATING A MEMORY DEVICE

(71) Applicant: Robert Bosch GmbH, Stuttgart (DE)

(72) Inventors: Michael Besemer, Esslingen (DE); Thomas Munz, Esslingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/946,472

(22) Filed: Apr. 5, 2018

(65) Prior Publication Data

US 2018/0292994 A1   Oct. 11, 2018

(30) Foreign Application Priority Data

Apr. 6, 2017   (DE) .................. 10 2017 205 899
Nov. 20, 2017  (DE) .................. 10 2017 220 708

(51) Int. Cl.
*G06F 12/00*   (2006.01)
*G06F 13/00*   (2006.01)
*G06F 13/28*   (2006.01)
*G06F 3/06*    (2006.01)

(52) U.S. Cl.
CPC .............. *G06F 3/065* (2013.01); *G06F 3/064* (2013.01); *G06F 3/0619* (2013.01); *G06F 3/0679* (2013.01)

(58) Field of Classification Search
CPC ............................... G06F 3/065; G06F 3/0619
USPC ........................................................ 711/103
See application file for complete search history.

(56) References Cited

U.S. PATENT DOCUMENTS

| 2006/0047895 | A1* | 3/2006 | Rowan | G06F 11/0727 |
| | | | | 711/112 |
| 2010/0287433 | A1* | 11/2010 | Mu | G06F 11/1666 |
| | | | | 714/746 |
| 2012/0250401 | A1* | 10/2012 | Storms | G11C 13/0004 |
| | | | | 365/163 |

* cited by examiner

*Primary Examiner* — Edward J Dudek, Jr.
*Assistant Examiner* — Sidney Li
(74) *Attorney, Agent, or Firm* — Norton Rose Fulbright US LLP; Gerard Messina

(57) ABSTRACT

A method for operating a memory device, in which a first memory region of the memory device can be written with blocks of data that are to be stored, including: storing of the data to be stored at a first target address, storing of the data to be stored at a second target address, the second target address differing from the first target address by a specifiable offset, and the specifiable offset being larger than 20 percent of the first memory region.

9 Claims, 4 Drawing Sheets

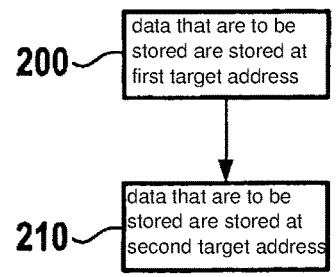
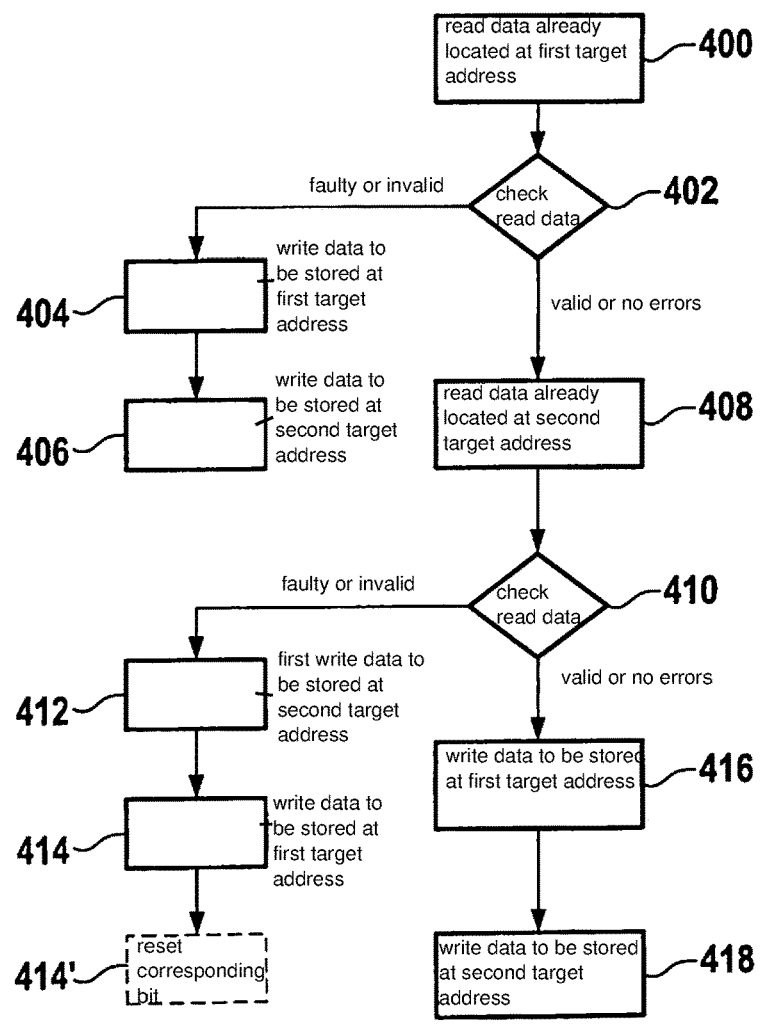
Fig. 3
Fig. 4

METHOD AND DEVICE OPERATING A MEMORY DEVICE

CROSS REFERENCE

The present application claims the benefit under 35 U.S.C. § 119 of German Patent Application No. DE 102017205890.0 filed on Apr. 6, 2017 and German Patent Application No. DE 102017220708.6 filed on Nov. 20, 2017, each of which is incorporated herein by reference in its entirety.

BACKGROUND INFORMATION

The present invention relates to a method for operating a memory device in which a first memory region of the memory device can be written with blocks of data that are to be stored.

The present invention also relates to a device for operating such a memory device.

Conventional commercial memory devices may have EEPROM (electrically erasable programmable read-only memory) memory elements in which data can be written in units of blocks without beforehand having to delete entire regions, which generally comprise a plurality of blocks. For example, in EEPROM-type memories, each address of the memory can be newly written without having to beforehand delete entire regions comprising a plurality of blocks. Such memory devices are used for example in control devices for internal combustion engines of motor vehicles and other technical systems.

Also, conventional so-called flash memories, or flash EEPROM memories, may have, generally, at least one entire region must first be deleted before individual blocks of the relevant region can be written to.

SUMMARY

An object of the present invention is provide an improved method and improved device in such a way as to provide increased flexibility and increased consumer utility.

In an example method according to the present invention, this object may be achieved by including the following steps: storing the data to be stored at a first target address, storing the data to be stored at a second target address, the second target address differing from the first target address by a specifiable offset, and the specifiable offset being larger then approximately 20% of the first memory region (i.e. larger than approximately 20% of the memory size of the first memory region). This may result in an advantage that, when there is a failure of individual memory cells or address regions of the memory device, the probability of a total loss of the data written according to the present invention is less than in conventional memory devices, because there is a first copy of the data to be written at the first target address and a second copy of the data to be written at the second target address (principle of "multiple storage"), so that the data to be written are stored redundantly at two different addresses in the memory device. A total loss of the data written in the method according to the present invention would require that both the data written at the first target address and the data written at the second target address become invalid, which is fairly improbable, in particular given punctiform errors of memory devices, because it has been observed that errors in memory devices are usually concentrated at a particular contiguous address region of the memory device (as long as the entire memory device does not fail).

In specific example embodiments, first a first copy of the data to be stored is stored at the first target address, and then the second copy of the data to be stored is stored at the second target address. In other specific embodiments, the reverse sequence is possible, i.e., first the second copy of the data to be stored is stored at the second target address, and then the first copy of the data to be stored is stored at the first target address.

In general, the specifiable offset between the first target address and the second target address can have both positive values (i.e., the second target address is greater than the first target address) and negative values (second target address is smaller than the first target address). In the following, for clarity, and without limitation of generality, specific embodiments are discussed in which the offset has positive values, so that the second target address is greater than the first target address.

In preferred specific embodiments, the specifiable offset is larger than approximately 40% of the first memory region, further increasing robustness.

In a further particularly preferred specific embodiment, the specifiable offset is approximately 50%, quite particularly preferably exactly 50%. This results in a particularly advantageous and efficient use of the memory device. In particular, this makes it possible to divide the first memory region of the memory device into a first subregion and a second subregion, the first copy, or only respective first copies, of the data to be written being stored in the first subregion, and the second copy, or only respective second copies, of the data to be written being stored in the second subregion. Particularly preferably, the first subregion and the second subregion are then equal in size, so that even in the case of a plurality of blocks of data that are to be written, the design according to the present invention can be applied, using the first copy and the second copy, with equally efficient exploitation of the available memory.

In a particularly preferred specific embodiment, the specifiable offset is constant. This means that the offset has the value for the corresponding specific embodiment, i.e. for example 50%, independent of the respective first target address or of the respective second target address.

In further specific embodiments, variants are also possible in which the offset is not constant. For example, different offsets from the corresponding second target address can be assigned to different values, or value ranges, for the first target address. In particular, in further specific embodiments variants are also possible in which a respective second target address is selected as a function of a corresponding first target address. This creates the possibility of assigning individual values for the offset to respective individual first target addresses.

In a further advantageous specific embodiment, the memory device has at least one of the following memory elements: EEPROM memory, PCM memory (phase-change random access memory, or phase change memory). In general, however, the design according to the present invention is applicable to all memory devices, or types of memory devices, in which a first memory region can be written to in blocks. In particular, the design according to the present invention can also be applied to optical and/or magnetic and/or other memory types.

In the present context, writing of data in blocks is to be understood as the writing of at least one block of data, where a block preferably has one or more bytes, for example 16 bytes, 32 bytes, or significantly more, for example 256 bytes. Optionally, a data block can also include additional information, such as version information or parity information or a checksum (e.g., according to the CRC principle). In particular, a block of data includes logically contiguous data, preferably secured by a checksum.

In a further advantageous specific embodiment, it is provided that the first memory region is divided into two subregions, and that the two subregions are essentially equal in size. This results in a clear separation, in which first target addresses can be assigned to the first of the two subregions, and second target addresses can be assigned to the second of the two subregions. If the two subregions are essentially equal in size, or, in a specific embodiment, are particularly preferably exactly equal in size, the possibility is advantageously provided of carrying out the redundant storing or multiple storing according to the present invention of data that are to be written for the entire available first subregion. If for example according to a first specific embodiment a memory device has a first memory element that has a capacity of 128 kB, then in a preferred specific embodiment a first subregion can include 64 kB, i.e., half of the overall memory capacity, and the second subregion can also include 64 kB.

In further specific embodiments, it is also possible that the two subregions to which the first and second target addresses can respectively be assigned are different in size. In this case, a multiple storage, or redundant storing, of the first copy or of the second copy of the data to be written can be carried out only to the extent that corresponding memory is free or available for writing in the two subregions.

In a preferred specific embodiment, the two subregions are located directly one after the other in an address space of the memory device. In other specific embodiments, at least one additional memory region is located between the two subregions in the address space of the memory device. In all of the cases named above, based on the first target address, using the offset that can be specified according to the present invention the second target address can be inferred or ascertained (and vice versa) in order to store a second copy of the data in the corresponding second subregion. This holds in particular even when the second subregion is not directly adjacent to the first subregion in the address space of the memory device.

In a further advantageous specific embodiment, it is provided that before storing the data that are to be stored, data located at the first target address or data located at the second target address are read. In a further specific embodiment, it is provided that the data located at the first target address are checked and/or the data located at the second target address are checked. From the above-named step of reading or checking of contained information, further specific embodiments can for example accordingly be used to control or to influence a subsequent process of storing the data to be stored.

For example, in a further advantageous specific embodiment it can be provided that a sequence of steps of storing at the first target address, or of storing at the second target address, is selected as a function of a check of the data located at the first target address and/or a check of the data located at the second target address. In this way, it is possible, as a function of a state existing before the current storage process of corresponding data at the first target address and/or at the second target address, for the following write process to selectively first write the data to the first target address or to selectively first write the data to the second target address. This can result in advantages for efficient memory use, if for example a first subregion, containing the first target addresses, of the first memory region is preferably used for read accesses, for example by user software or the like.

In a further advantageous specific embodiment, it is provided that the data to be stored are supplemented with an item of information that characterizes the target address at which the data to be stored are first stored. For example, the supplemental information can comprise 1 bit, and the corresponding bit is then set to one ("1") if the data to be stored are first stored at the first target address, and the corresponding bit is set to zero ("0") if the data to be stored are first stored at the second target address. From this, in particular even when the storage process is aborted before being completed, it can later be inferred what age, or what version, the data correspondingly located at the relevant target addresses have. For this purpose, the above-named bit can be evaluated. Alternatively, supplemental information can also include more than 1 bit, or a plurality of bytes, correspondingly providing further degrees of freedom, for example for identifying one of many possible versions of a corresponding block, and the like.

In a further advantageous specific embodiment, it is provided that data located at the first target address are read, whereby first read data are obtained, and data located at the second target address are read, whereby second read data are obtained, it being optionally checked whether the first read data and/or the second read data are invalid. In this way, particularly reliable read accesses, and a secure provision of previously stored data, can be realized. A check of the data for validity can for example be carried out through a comparison of the first read data with the second read data. In further specific embodiments, the check of the validity of the read data can for example take place using an evaluation of a checksum that, according to other specific embodiments, can be contained in the corresponding read data. For this purpose, in further specific embodiments when there is a write access a supplementing of the data to be written with the respective checksum can be provided.

Advantageous specific embodiments of the present invention are described herein.

The present invention also includes a computer program product.

Further features, possible applications, and advantages of the present invention result from the following description of exemplary embodiment of the present invention, shown in the figures. All described or presented features, by themselves or in any combination, form the subject matter of the present invention, independent of their formulation or representation in the description herein or in the figures.

BRIEF DESCRIPTION OF THE DRAWINGS

FIG. 3 schematically shows a simplified flow diagram of a specific embodiment of the method according to the present invention.

FIG. 4 schematically shows a simplified flow diagram of a further specific embodiment.

DETAILED DESCRIPTION OF EXAMPLE EMBODIMENTS

Figure 1:
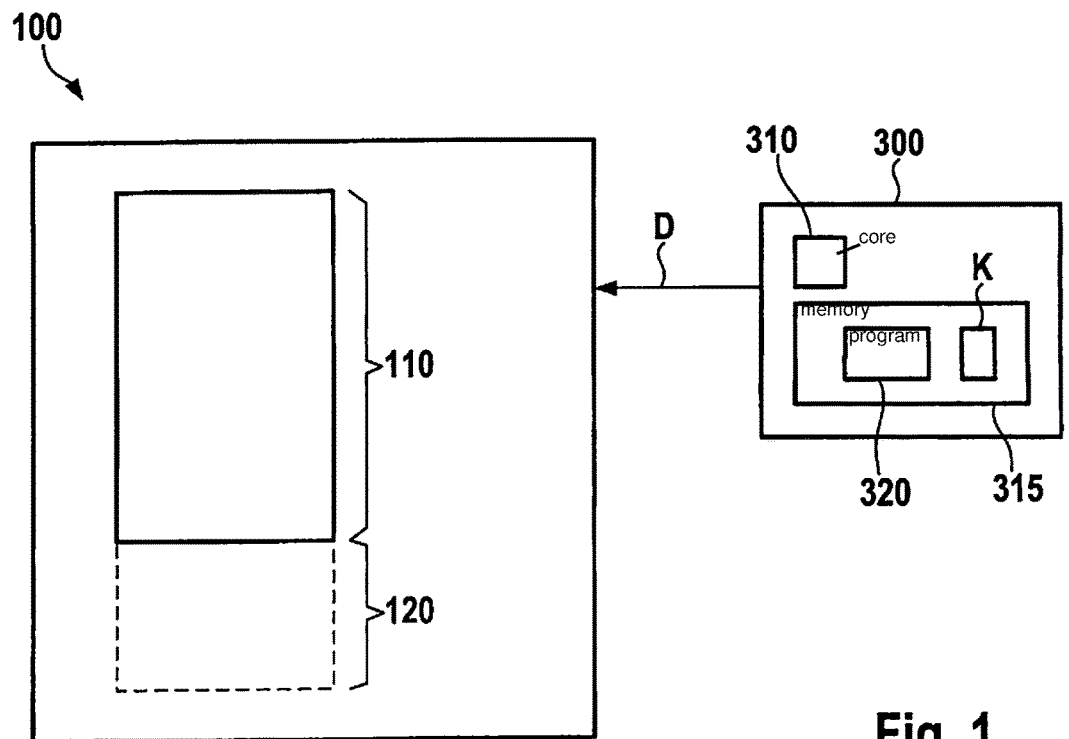
FIG. 1 schematically shows a block diagram of a device according to a specific embodiment.

FIG. 1 schematically shows a block diagram of a memory device 100 that has one or more memory elements of the EEPROM type, not shown in FIG. 1 for clarity, defining a first memory region 110. First memory region 110 can be written with blocks of data D that are to be stored. For example, data D to be stored are supplied to memory device 100 by a device 300 explained in more detail below. In particular, data D supplied to memory device 100 can be stored in first memory region 110 using the design according to the present invention, described in more detail below.

In the present context, a writing of data in blocks is understood as the writing of at least one block of data having one or more bytes, for example 16 bytes, 32 bytes, or significantly more, such as 256 bytes. Optionally, a data block can also include additional information, for example, version information or parity information or a checksum (e.g. according to the CRC principle). In particular, a block of data includes logically contiguous data, preferably secured by a checksum.

Alternatively or in addition, the memory elements of memory device 100 can also be of the PCM type, or any other type of memory that enables a writing of data in blocks. PCM memories behave externally in a manner similar to EEPROMs, in particular serial EEPROMs, in which data can be modified at any time without having to delete an entire region beforehand, as is required in flash EPROMs.

Optionally, memory device 100 can also have at least one additional memory region 120. In many specific embodiments, it is provided that data can be stored in further memory region 120 according to conventional methods, and not necessarily according to the design on which the present invention is based. This is assumed in the further description below. In further specific embodiments, however, data can also be stored in further memory region 120 according to the design of the present invention.

FIG. 1 further schematically shows a device 300 for operating memory device 100 according to a specific embodiment. Device 300 can for example be a computing unit, such as a microcontroller or the like, designed to carry out the method according to the present invention, which is described below in more detail on the basis of examples. Device 300 has for example a computing core 310 that executes a computer program 320 that realizes one or more steps of the method according to the present invention. Computer program 320 can be stored at least temporarily in a working memory or some other memory 315 allocated to device 300, for example a program memory 315, and can thus be available for execution by computing core 310.

Figure 2:
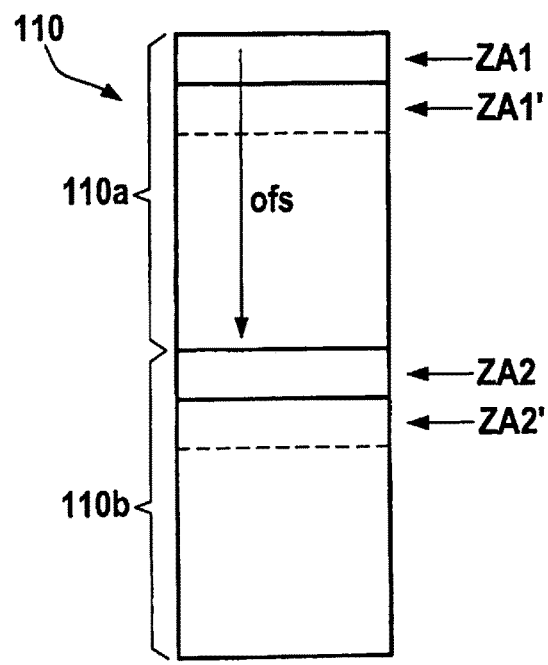
FIG. 2 schematically shows a block diagram of a memory region according to a specific embodiment.

FIG. 2 schematically shows a block diagram of first memory region 110 according to a specific embodiment. In the present case, first memory region 110 is for example divided into two subregions 110a, 110b, which preferably succeed one another directly in the address space of memory device 100 (FIG. 1). Other specific embodiments, in which the two subregions 110a, 110b do not succeed one another directly, are also possible.

FIG. 3 schematically shows a simplified flow diagram of a specific embodiment of the method according to the present invention. In a first step 200, data D that are to be stored in memory device 100 (FIG. 1), for example a block of data (hereinafter "data block" or block) are stored at a first target address ZA1 (FIG. 3). This is equivalent to saying that a first copy of data D to be stored is stored in memory device 100 at first target address ZA1. In a second step 210 (FIG. 3), the data D to be stored in memory device 100 are then also stored at a second target address ZA2 (FIG. 2), second target address ZA2 differing from first target address ZA1 by a specifiable offset ofs. This is equivalent to saying that a second copy of data D to be stored is stored in memory device 100 at second target address ZA2. Thus, according to a specific embodiment, as a result identical copies of data D to be stored are now present in memory device 100, once in first subregion 110a at first target address ZA1, and once in second subregion 110b at second target address ZA2.

In accordance with the present invention, the specifiable offset ofs is larger than approximately 20% of first memory region 110a, or the memory size of first memory region 110a. In the present case, the specifiable offset ofs is selected such that it is approximately 50% of first memory region 110, i.e., approximately 50% of the overall memory size of first memory region 110, which in the present case corresponds to the sum of the memory sizes of the two subregions 110a, 110b.

Thus, if for example a memory size of first memory region 110 is 64 kB, then according to a preferred specific embodiment offset ofs can be selected to be 32 kB, and the two subregions 110a, 110b are each 32 kB in size.

In this way, it is achieved that the second copy of the data to be stored at second target address ZA2 are stored comparatively "far"—relative to a linear address space of memory device 100—from the memory location of the first copy of the data to be stored at first target address ZA1, thus significantly increasing memory security against errors affecting subregions of memory device 100.

In addition, through the double storage described here, in which two identical copies of data D to be stored are preferably stored at target addresses ZA1, ZA2, a degree of redundancy is advantageously provided that is tolerant against failure of one of the two copies, or corresponding subregions 110a, 110b of memory device 100.

In addition, the determination of the specifiable offset ofs as approximately 50% of the size of first memory region 110 advantageously provides a division of first memory region 110 into a first subregion 110a (FIG. 2) and a second subregion (110b). Insofar as for example the above-named offset ofs according to the present invention is chosen to be constant for all target addresses within first memory region 110a, for example in the present case to be 50%, it is ensured that all first copies of data to be written are stored within first subregion 110a, while all second copies of the data to be written are stored within second subregion 110b; as a result, in particular when there is selective overwriting of individual data blocks or target addresses in the respective subregions, there results a comparatively low degree of fragmenting, or no fragmenting at all, so that memory device 100 can be made use of particularly efficiently, and above all completely, using the design according to the present invention. In other words, for example the entire first subregion 110a can be filled with first copies of data that are to be written or stored, and, through the above-named layout of the subregions, or selection of offset ofs, it is ensured that for each first copy in first subregion 110a, in second subregion 110b a corresponding memory segment is free in order to accommodate a corresponding second copy. In this way, first subregion 110a forms, as it were, a first storage location for data blocks to be stored, and second subregion 110b forms, as it were, a second storage location for data blocks to be stored, advantageously enabling a double storage that, as described already, is particularly robust against memory errors.

If for example, according to a further specific embodiment, further data are to be written to memory device 100, a corresponding first copy can for example be stored at target address ZA1', also shown in FIG. 2, while the corresponding second copy can for example be stored at target address ZA2', also shown in FIG. 2, and so on.

In the above-described preferred specific embodiment, a constant offset ofs is accordingly used to ascertain, for a first target address ZA1 for a first copy of data D to be written, a corresponding second target address ZA2 for the second copy of data D to be written. Given a constant offset ofs, this can clearly be done efficiently. In particular, with knowledge of first target address ZA1 and of constant offset ofs, second target address ZA2 can be ascertained efficiently, and vice versa. In many specific embodiments, the writing of the two copies can also take place in a different sequence, i.e. first a writing of the data to be stored to the second target address, and then a writing of the data to be stored to the first target address. Here as well, the relevant target address can be ascertained efficiently based on a specification and the offset proposed according to the present invention.

In a further advantageous specific embodiment, it is possible that offset ofs described above, preferably selected to be constant, is nonetheless changed from time to time. For example, this can take place at comparatively large intervals, comprising several 10,000 write accesses, or even several 100,000 write accesses, to a corresponding subregion of memory device 100. In this way, it is advantageously possible, after a comparatively long period of operation of memory device 100, to relocate a subregion of the memory device, to be used to provide second target addresses ZA2, ZA2', from second subregion 110b to another subregion (not shown in FIG. 2) in a different address region of memory device 100. This other subregion can for example be reserved specifically for the use described above, and therefore not used, or only used to a comparatively limited extent, for write accesses during the operating period up to then, in order in future to enable a reliable storing of the second copies of the data to be stored. Details concerning this are described below with reference to FIG. 8.

In other specific embodiments, a sequence that is reversed relative to the present one is also conceivable during storing, with reference to FIG. 3, so that first the second copy of the data to be stored is stored at second target address ZA2 (FIG. 2), and the first copy of the data to be stored is then stored at first target address ZA1.

In a further advantageous specific embodiment, it is provided that before the storing 200, 210 (FIG. 2) of data D to be stored (FIG. 1), data located at first target address ZA1 (FIG. 2) or data located at second target address ZA2 are read.

In a further specific embodiment, it is provided that the data located at first target address ZA1 are checked and/or the data located at second target address ZA2 are checked.

Information obtained from the above-named steps of reading or checking can for example be used, according to further specific embodiments, to control or to influence a subsequent process of storing the data to be stored.

For this purpose, FIG. 4 shows as an example a simplified flow diagram of a specific embodiment of the method according to the present invention. In the following exemplary explanation, it is assumed that data D to be stored (FIG. 1) are present that, as described above, are to be written to a first target address ZA1 and to a second target address ZA2 in memory device 100.

In a first step 400, data already located at first target address ZA1 are read. These data can for example be data written previously to first target address ZA1, or also initialization data or the like. In step 402, there takes place a checking of the data read in step 400, for example with evaluation of a checksum contained in the read data. In a further advantageous specific embodiment, such a checksum can for example also be ascertained in the context of the method according to the present invention, or integrated into the data D to be stored. In many specific embodiments, computing unit 300 can form such a checksum as a function of the data to be stored and integrated into these data, in particular even before data D to be stored are handed over to memory device 100.

If in step 402 it is determined that the data read in step 400 are faulty or invalid, then branching takes place in step 404, in which the data to be stored are written to first target address ZA1. The data to be stored are then also written to second target address ZA2, which takes place in step 406.

If, in contrast, in step 402 it is determined that the data read in step 400 are valid, or do not contain errors, then branching takes place in step 408, in which the data already located at second target address ZA2 are read. Analogous to step 402, in the following step 410 there takes place a checking of the data read in step 408, for example again with evaluation of a checksum contained in the read data. If in step 410 it is determined that the data have errors or are invalid, then branching takes place in step 412, in which the data to be stored are first stored at second target address ZA2. In step 414, the data to be stored are then also stored at first target address ZA1.

If, in contrast, in step 410 it is determined that the data read in step 408 are (likewise) valid, or do not contain errors, then branching takes place in step 416, in which the data to be stored are written to first target address ZA1. The data to be stored are then also written to second target address ZA2, which takes place in step 418.

In the specific embodiment described above with reference to FIG. 4, it is accordingly provided that a sequence of the steps of storing the data D to be stored at first target address ZA1, or of storing the data D to be stored at second target address ZA2, is selected as a function of a check 402 of the data already located at the first target address and/or a check 410 of the data already located at the second target address. In this way, it is for example possible, as a function of a state existing before the current storing process of corresponding data at the first target address and/or at the second target address, for the following write process to selectively first write the data to the first target address or to selectively first write the data to the second target address. This can result in advantages for an efficient memory use, if for example a first subregion 110a (FIG. 1) of first memory region 110, containing first target addresses ZA1, ZA1', is preferably used for read accesses, for example by user software executed at computing unit 300 or the like.

In a further advantageous specific embodiment, it is provided that the data D to be stored are supplemented with an item of information that characterizes the target address at which the data to be stored are first stored. For example, the supplemental information can comprise 1 bit, and the corresponding bit is then set to one ("1") if the data to be stored are first stored at the first target address, and the corresponding bit is set to zero ("0") if the data to be stored are first stored at the second target address. From this, in particular even when there is an abortion of the storage process before it is completed (both storage steps), it can later be inferred what age or what version the data correspondingly located in the relevant target addresses of memory device 100 have. For this purpose, in a corresponding read process the above-named bit can be evaluated.

For example, such a bit can optionally be set in step 412 and stored together with the data to be written, in particular integrated into the data to be written. The quantity of useful data that can be contained in the data block to be written is correspondingly reduced. Correspondingly, the bit of this type can optionally be reset in step 414 and stored together with the data to be written in step 414, in particular integrated into the data to be written. Optionally, after step 414 step 414' can be further carried out, in which the corresponding bit is reset at the second target address.

If, in the process named above, for example after step 412 there takes place an interruption in the operation of memory device 100, for example due to failure of an electrical operating voltage supply, then the data D to be written or to be stored through the sequence according to FIG. 4 are already located at second target address ZA2, these data being characterized by the set bit, because step 412 has already been carried out. Due to the interruption, however, the following step 414 can no longer be carried out, so that the data D to be stored cannot additionally be stored at first target address ZA1. In contrast, however, the data located at first target address ZA1 do not have a set bit, but rather may have a reset bit (cf. step 414'), based on an interruption-free operation in the preceding write cycle with regard to target addresses ZA1, ZA2. In this case, due to the different states of the relevant bit at the different target addresses ZA1, ZA2, the above-described case of interruption can be recognized, and for example the state of the bit can also be evaluated for a read access.

In a further advantageous specific embodiment, described below with reference to the simplified flow diagram of FIG. 5, it is provided that data located at the first target address are read (cf. step 420), whereby first read data are obtained, and that data located at the second target address are read (cf. step 422), whereby second read data are obtained. In step 424 it is then checked whether the first read data and/or the second read data are valid or have errors, which in turn can take place through evaluation of a corresponding checksum.

If the check in step 424 yields the result that a data set of the first read data and second read data (for example the first read data) has errors, then in step 426 the remaining, correct data set (for example the second read data) is outputted as the read data, for example to computing unit 300.

However, if the check in step 424 yields the result that neither the first read data nor the second read data have errors, branching takes place to step 428, and either the first read data or the second read data can be used as read data, or outputted, again for example to computing unit 300.

Figure 5:
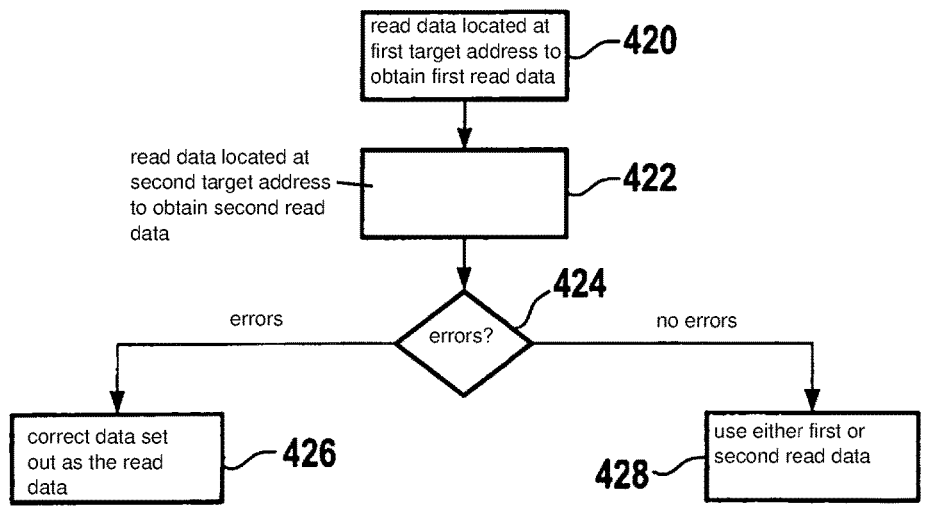
FIG. 5 schematically shows a simplified flow diagram of a further specific embodiment.

If the bit described above with reference to the optional specific embodiment of FIG. 4 has been used in preceding storage processes, then optionally in step 428, according to FIG. 5, this bit, or a comparable counter value or the like, which can likewise be contained in the stored data, can also be evaluated in order to ascertain whether the first read data or the second read data are used as read data, or are outputted to computing unit 300. In this way, in step 428 it can advantageously be determined which of the two read data are more up-to-date.

Figure 6:
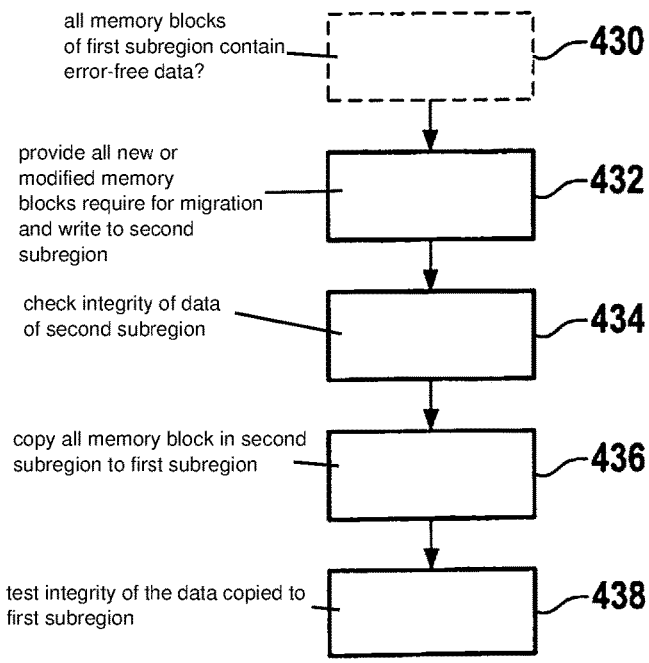
FIG. 6 schematically shows a simplified flow diagram of a further specific embodiment.

FIG. 6 schematically shows a simplified flow diagram of a further specific embodiment. Shown here is a process also referred to as migration, in which the content of one or more memory blocks of first memory region 110 (FIG. 1) is modified. In particular, during such a migration the size of individual memory blocks can also change, so that a pure overwriting of an existing memory block at a particular target address by the new, larger memory block is not possible, because here a part of the following existing memory block would be overwritten. In addition, in such a migration blocks may be completely newly added or omitted.

Using the design according to the present invention, described above with reference to FIGS. 1 through 5, however, such a migration, carried out in the context of a change from a first software version to a second software version of computing unit 300, can be carried out efficiently and securely.

In an optional first step 430 (see FIG. 6), it is first checked whether all memory blocks of first subregion 110a contain error-free data; this can for example be done by evaluating the checksums assigned to the relevant memory blocks or integrated therein. If the check in step 430 yields the result that there is an error in at least one memory block, the method can be aborted, or an error handling routine can be introduced. According to a specific embodiment, the error handling routine can for example include a method for removing the error, i.e., repairing the error. Here, for example a block recognized as having an error can be read again, the corresponding checksum can be recalculated and for example integrated in the block, and the block can then be written again. Preferably, however, an error-free copy of the block recognized as having an error in first subregion 110a can also be read from second subregion 110b and copied to first subregion 110a.

However, if the check in step 430 yields the result that all memory blocks of first subregion 110a contain error-free data, then the method continues according to FIG. 6 with the following step 432. In step 432, all new or modified memory blocks required for the migration are now provided and are written, preferably one after the other, in particular to successive target addresses, to second subregion 110b of first memory region 110. This process can also be understood as the application of a new memory layout in second subregion 110b. This can be carried out unproblematically, because memory contents required for an interruption-free operation (in particular the complete layout of the memory contents) of the software state used before the migration continue to be present in error-free condition in first subregion 110a, as the optional check of step 430 described above has indicated. In other words, a user software application or some other software that may be running on computing unit 300, which for example has to read (and/or write) data from the software version existing before the migration from memory device 100, can access first subregion 110a, while in step 432 memory blocks required for the new software version, important after the migration, can be assembled to second subregion 110b. Here, checksums or comparable mechanisms are again advantageously used to enable a checking of the integrity of the data stored in the individual memory blocks in second subregion 110b. In a particularly preferred specific embodiment, new blocks for the new memory layout (which are thus not already present in the form of a first copy in first subregion 110a) are loaded from a corresponding source, or are applied as a function of specifiable initialization data. Blocks already present in first subregion 110a can advantageously easily be copied from first subregion 110a to second subregion 110b for the formation of the new layout in second subregion 110b.

In a specific embodiment, items of information that characterize a number, a type, a size, a (relative) position in the memory (for example offset from the beginning of the relevant subregion of the memory), and other characterizing data of blocks to be stored in memory 100 can for example be stored in a memory device of computing unit 300, i.e., in particular not (or at least not only) in memory device 100 itself. According to a further specific embodiment, the totality of this information can also be designated as the configuration or layout of the memory of memory device 100, or of a corresponding subregion 110a, 110b. Configuration K (FIG. 1), or the layout, can for example also be stored in program memory 315 of computing unit 300.

In step 434 (FIG. 6), there then takes place the above-named checking of the integrity of the data of second subregion 110b, stored in the individual memory blocks.

If the check in step 434 yields the result that at least one memory block of second subregion 110b has errors, then an error handling routine (not shown) can be introduced, or the relevant memory block or blocks can be rewritten. This is not shown in FIG. 6 for clarity.

However, if the check in step 434 yields the result that all memory blocks of second subregion 110b are error-free, then the method continues with step 436. In step 436, all memory blocks assembled in second subregion 110b, or written therein, are now copied to first subregion 110a, for example advantageously by a single copying process having the entire subregion as its subject matter, and in the following step 438 there takes place a test of the integrity of the data copied to first subregion 110a.

In other specific embodiments, the process described above with reference to FIG. 6 can also be carried out in the reverse sequence with reference to the two subregions 110a, 110b. In other words, for example first subregion 110a can also first be written with the new layout, or the new data blocks, and the roles of the two subregions 110a, 110b can be reversed.

In a further preferred specific embodiment, the carrying out of the method described above with reference to FIG. 6 is advantageously controlled by driver software that controls memory device 100 in a corresponding manner. According to the design described above, the driver software is advantageously able to read an old memory layout already existing in memory device 100 (or in one of its subregions 110a, 110b), and to efficiently transfer it to the new layout. Using the design described above (in particular also using the optional insertion of a bit for characterizing the data version; cf. steps 412, 414, 414' of the sequence according to FIG. 4), this process is particularly robust against interruptions, because in the case of interruption occurring during the method sequence according to FIG. 6, the method can be restarted or continued at any time without errors. In particular, the application of the design according to the present invention also prevents the occurrence of data losses that can occur in conventional systems as a result of interruptions.

Figure 7:
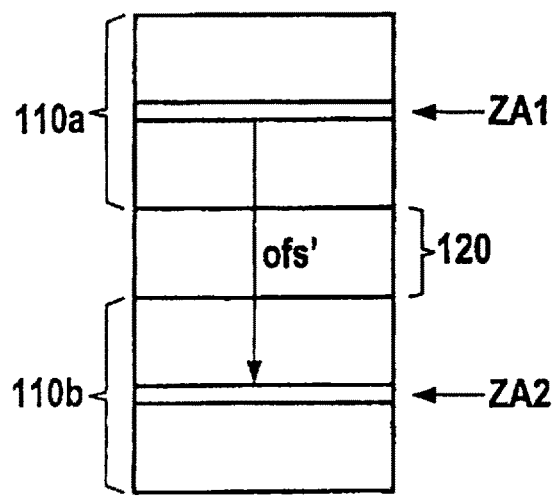
FIG. 7 schematically shows a block diagram of a memory region according to a further specific embodiment.

FIG. 7 schematically shows a block diagram of a memory region of memory device 100 according to a further specific embodiment. In the present case, subregions 110a, 110b for the application of the design according to the present invention are not located directly in succession in an address space of memory device 100. Rather, as can be seen in FIG. 7, further memory region 120 is located between them, which in the present case is used for the storage of data according to a conventional method, for example without double storage or a safety copy. Through the selection of an adequately large specifiable offset ofs', which in the present case is preferably constant, it is in turn ensured that an efficient storing of the data to be stored is possible both at first target address ZA1 in first subregion 110a and also at second target address ZA2 in second subregion 110b.

Figure 8:
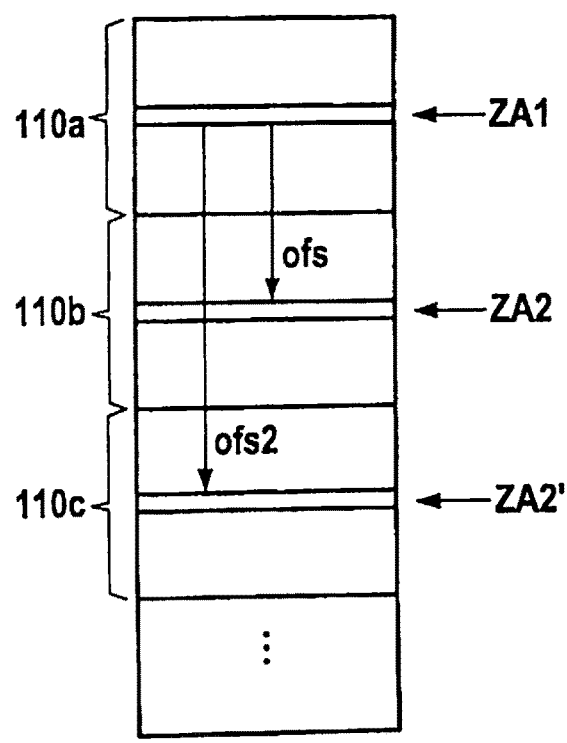
FIG. 8 schematically shows a block diagram of a memory region according to a further specific embodiment.

FIG. 8 schematically shows a block diagram of a memory region of memory device 100 according to a further specific embodiment. In the present case, subregions 110a, 110b are located in direct succession in a linear address space of memory device 100 (FIG. 1). A first specifiable offset ofs defines, as described above with reference to FIG. 2, FIG. 7, first and second target addresses ZA1, ZA2 in memory device 100 for the storage according to the present invention, in particular the redundant storage, of data to be stored. As can be seen in FIG. 8, in the present case a third subregion 110c is also provided whose address space is revealed through the use of a second offset ofs2, second offset ofs2 being larger in the present case then first offset ofs. This is useful in particular when a comparatively large number of write operations to second subregion 110b have already taken place, so that a reliable holding of data in second subregion 110b cannot be assured to the same extent as in other memory regions 110c of memory device 100 that have experienced a lower write load during their operating time, for example due to a corresponding reservation. In other words, through the change from first offset ofs to second offset ofs2, it is advantageously possible to access third subregion 110c for the storing of second copies at second target addresses ZA2', while the first copies for example continue to be stored at first target addresses ZA1 in first subregion 110a. The above-described change from the first to the second offset can for example be carried out approximately every 100,000 write cycles, relative to second subregion 110b. Depending on the memory technology for memory device 100, different values (more or fewer) can also be selected here.

The design according to the example embodiments of the present invention described above enables an efficient storing of data in memory device 100, and in particular a better exploitation of memory device 100 than conventional methods. This results advantageously in cost savings, because only as much physical memory has to be reserved for memory device 100 as is actually required. Based on the example described above with reference to FIG. 2, the entire memory capacity of first or second subregion 110a, 110b is, thus, available for accommodating information to be stored, such as data blocks, while the respective other subregion is used primarily for the application of the design according to the present invention according to some specific embodiments.

In addition, using the design according to the present invention, the complexity can be reduced of driver software that is for example provided in computing unit 300 to control write accesses and/or read accesses to memory device 100. The driver software can for example be used to give a defined access to memory device 100 to other software components running on computing unit 300. Due to the lower complexity of the driver software compared to conventional solutions, a corresponding memory requirement in a program memory 315 (FIG. 1) of computing unit 300 can be reduced, which also reduces costs. In a preferred specific embodiment, the driver software is located in a program memory 315 of computing unit 300, if warranted together with other programs such as application programs. In contrast to program memory 315 of computing unit 300, in a specific embodiment memory device 100 can advantageously be used at least predominantly for storing data instead of program code.

A further savings of costs through the application of the design according to the present invention advantageously results due to the fact that the functioning of the design according to the present invention, or of a corresponding memory device 100 or of computing unit 300, is comparatively easy to test.

In many specific embodiments, through a suitable partitioning of the memory medium, or of primary memory region 110, into two blocks, in particular two equally large subregions 110a, 110b (FIG. 2), it is possible to carry out a migration, or essential reorganization, of the data stored in the primary memory region 110 without having to keep further memory regions free for this purpose. In addition, it is also advantageously possible during a migration to read data from memory device 100 and/or to write it thereto, because, for example at least in first subregion 110a, a consistent layout of blocks stored therein is always present. In other words, such a migration can also take place in the background, while regular operation, in particular access to memory device 100, for example by computing unit 300, continues to be possible.

Particularly advantageously, using the design according to the present invention the memory device, or first memory region 110a, can be filled 100% with data or data blocks without limitations when there is a software update in the field with resorting or migration, which may be necessary for the update, of the data in memory device 100.

Due to the provision of the specifiable offset ofs according to the present invention, the first copy and the second copy of a double storage are not located in direct succession with regard to their addresses in the address space of the memory device, but rather are located comparatively far from one another, at first target addresses ZA1 (FIG. 2) and second target addresses ZA2. Thus, when there is a failure of individual address regions in memory device 100, no data, or at least not all data, are lost, which is a robust solution.

The application of the design according to the present invention in memory device 100 is particularly easy to realize, and also to test, in comparison with conventional solutions. This saves costs during development.

What is claimed is:

1. A method for operating a memory device, in which a first memory region of the memory device can be written with blocks of data that are to be stored, the method comprising:
   storing the data to be stored at a first target address;
   storing the data to be stored at a second target address, the second target address differing from the first target address by a specifiable offset, and the specifiable offset being larger than 20 percent of the first memory region;
   prior to the storing of the data to be stored, reading at least one of data located at the first target address and data located at the second target address;
   after the reading, checking at least one of: the data read from the first target address, and the data read from the second target address;
   wherein a sequence for the steps of the storing at the first target address and the storing at the second target address is selected as a function of at least one of: the check of the data read from the first target address, and the check of the data read from the second target address.

2. The method as recited in claim 1, wherein the specifiable offset is 50 percent of the first memory region.

3. The method as recited in claim 1, wherein the memory device includes at least one of the following memory elements: EEPROM memory, and PCM memory.

4. The method as recited in claim 1, wherein the first memory region is divided into two subregions, the two subregions being equal in size.

5. The method as recited in claim 1, wherein the data to be stored are supplemented with an item of information that characterizes a target address at which the data to be stored are first stored.

6. The method as recited in claim 1, further comprising:
   reading data located at the first target address, whereby first read data are obtained, and reading data located at the second target address, whereby second read data are obtained.

7. The method as recited in claim 6, further comprising:
   checking whether at least one of the first read data and the second read data are invalid.

8. A device for operating a memory device, in which a first memory region of the memory device is capable of being written with blocks of data to be stored, the device being designed to:
   store the data to be stored at a first target address; and
   store the data to be stored at a second target address, the second target address differing from the first target address by a specifiable offset, and the specifiable offset being larger than approximately 20 percent of the first memory region;
   prior to the storing of the data to be stored, read at least one of data located at the first target address and data located at the second target address;
   after the reading, check at least one of: the data read from the first target address, and the data read from the second target address;
   wherein a sequence for the storing at the first target address and the storing at the second target address is selected as a function of at least one of: the check of the data read from the first target address, and the check of the data read from the second target address.

9. A non-transitory computer-readable storage medium on which is stored a computer program product that can be loaded into a memory of a computer and that includes software code segments, the computer program product for operating a memory device, in which a first memory region of the memory device can be written with blocks of data that are to be stored, the computer program product, when executed by the computer, causing the computer to perform:
   storing the data to be stored at a first target address;
   storing the data to be stored at a second target address, the second target address differing from the first target address by a specifiable offset, and the specifiable offset being larger than 20 percent of the first memory region;
   prior to the storing of the data to be stored, reading at least one of data located at the first target address and data located at the second target address;
   after the reading, checking at least one of: the data read from the first target address, and the data read from the second target address;
   wherein a sequence for the steps of the storing at the first target address and the storing at the second target address is selected as a function of at least one of: the check of the data read from the first target address, and the check of the data read from the second target address.

* * * * *

UNITED STATES PATENT AND TRADEMARK OFFICE
CERTIFICATE OF CORRECTION

| | | |
|---|---|---|
| PATENT NO. | : 10,452,309 B2 | Page 1 of 1 |
| APPLICATION NO. | : 15/946472 | |
| DATED | : October 22, 2019 | |
| INVENTOR(S) | : Michael Besemer and Thomas Munz | |

It is certified that error appears in the above-identified patent and that said Letters Patent is hereby corrected as shown below:

On the Title Page

In Item (30) Foreign Application Priority Data, replace:
"DE 10 2017 205 899"
With:
-- DE 10 2017 205 890 --

Signed and Sealed this
Twenty-first Day of January, 2020

Andrei Iancu
*Director of the United States Patent and Trademark Office*